United States Patent [19]
Horton et al.

[11] Patent Number: 4,862,947
[45] Date of Patent: Sep. 5, 1989

[54] METHOD OF CASTING AN ARTICLE

[75] Inventors: Robert A. Horton, Chesterland; Arunachalam Jeyarajan, Euclid; Lawrence D. Graham, Chagrin Falls, all of Ohio

[73] Assignee: PCC Airfoils, Inc., Cleveland, Ohio

[21] Appl. No.: 227,544

[22] Filed: Aug. 2, 1988

[51] Int. Cl.$^4$ .............................................. B22D 25/00
[52] U.S. Cl. .............................. 164/122.2; 164/122.1; 164/125
[58] Field of Search ...................... 164/14, 72, 74, 122, 164/122.1, 122.2, 125, 138

[56] References Cited
U.S. PATENT DOCUMENTS

| | | |
|---|---|---|
| 2,618,032 | 11/1952 | Traenkner . |
| 3,153,826 | 10/1964 | Horton . |
| 3,256,574 | 6/1966 | Lirones . |
| 3,401,735 | 9/1968 | Pursall . |
| 3,494,709 | 2/1970 | Piearcey . |
| 3,645,767 | 2/1972 | Taylor . |
| 3,683,996 | 8/1972 | Dunlop . |
| 4,133,368 | 1/1979 | Hayes . |
| 4,475,582 | 10/1984 | Giamei et al. . |
| 4,549,599 | 10/1985 | Reiner et al. . |
| 4,550,764 | 11/1985 | Horton et al. . |

FOREIGN PATENT DOCUMENTS 55-128345  10/1980  Japan .................................. 164/122

OTHER PUBLICATIONS

Publication entitled DYLON DATA (three pages), exact publication date unknown, however publication occurred prior to Jan. 1, 1988.

Primary Examiner—Kuang Y. Lin
Attorney, Agent, or Firm—Tarolli, Sundheim & Covell

[57]  ABSTRACT

An improved mold has a coating of material having a relatively high emissivity. The surface of the coating has an emissivity which is at least twice as great as the emissivity of the surface of the ceramic mold material. When the mold is removed from a furnace chamber, the surface of the coating radiates heat at a relatively high rate. In one embodiment of the invention, the coating is applied to only a portion of the surface of a ceramic mold. In another embodiment of the invention, the coating of material having a relatively high emissivity is applied to only a portion of a crystal selector on a mold for a single crystal article. The relatively high rate of radiation of heat from the coated portion of the crystal selector increases the rate of growth of an adjacent single crystal grain. If desired, the entire mold can be covered with the coating of material having a relatively high emissivity. The coating of material having a high emissivity may be formed of graphite.

49 Claims, 2 Drawing Sheets

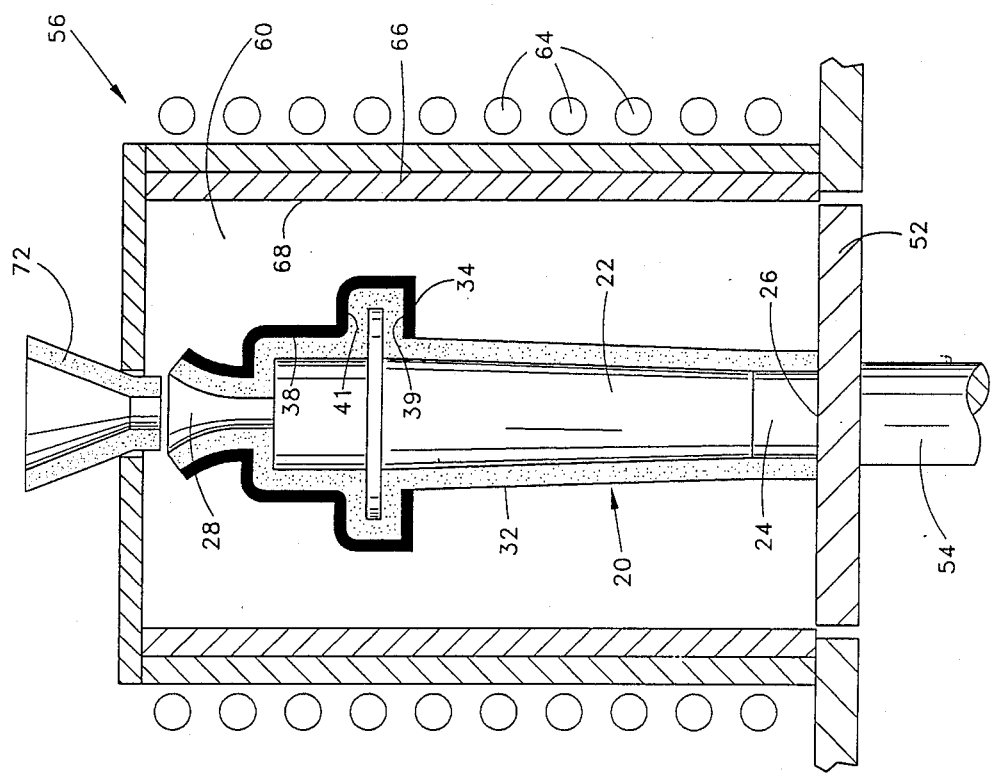
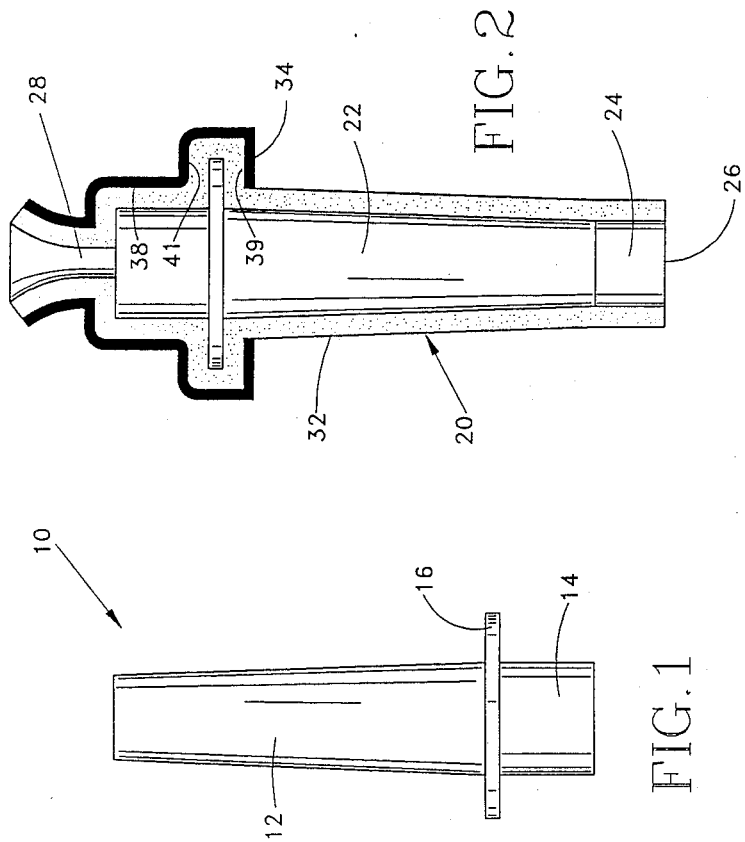
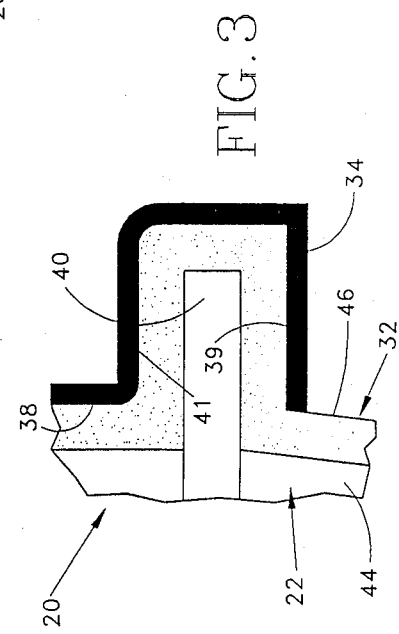

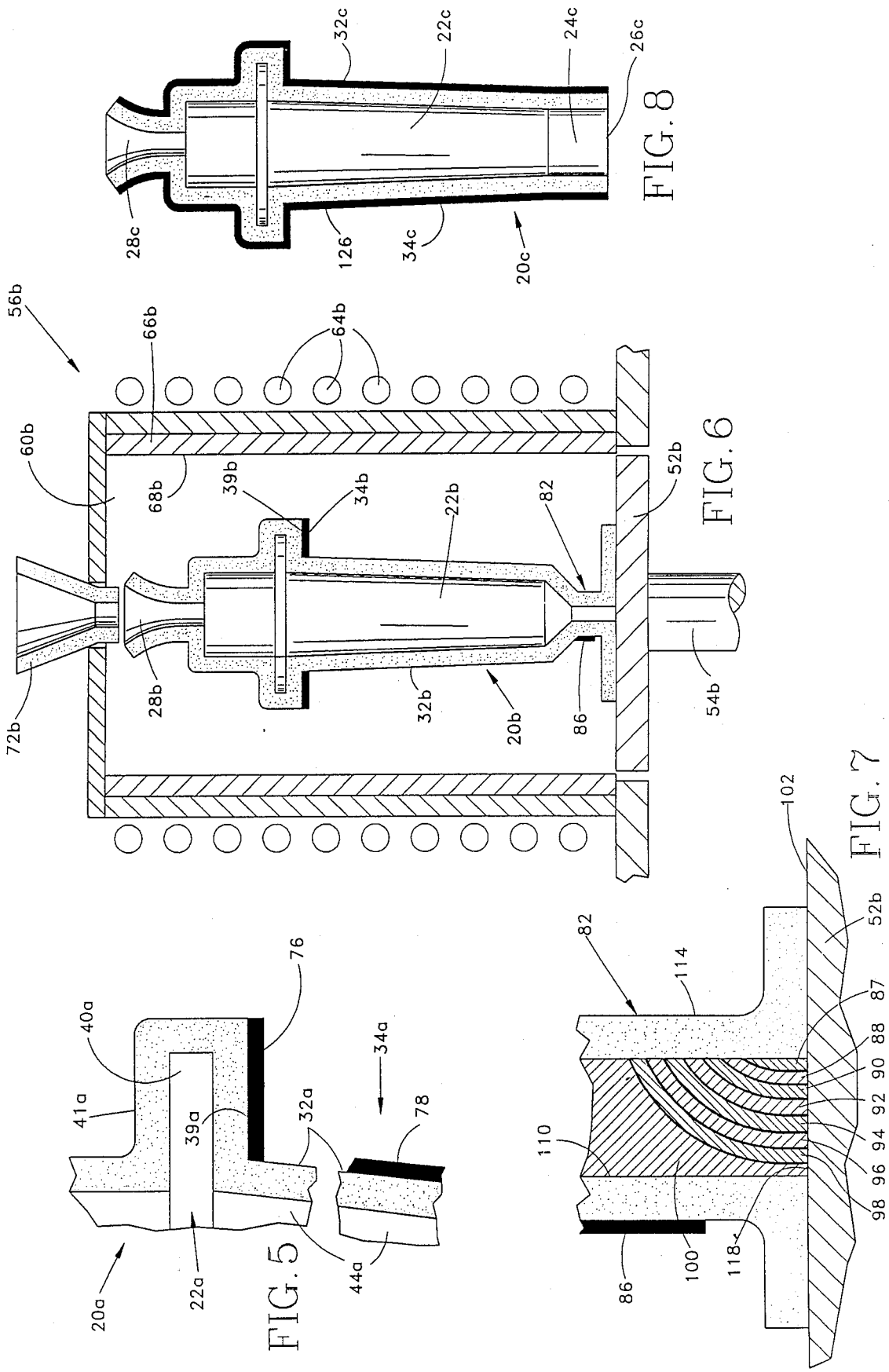

METHOD OF CASTING AN ARTICLE

BACKGROUND OF THE INVENTION

The present invention relates to an improved method of casting an article.

Molds for reactive metals have previously been formed of graphite to minimize reaction with the metal to be cast and to allow the temperature at which the metal is cast to be increased. In making the mold, a wax pattern or cluster is repetitively dipped in colloidal graphite and stuccoed with particles of graphite. Since the graphite in the resulting mold will be consumed when heated to a temperature above 430° C., in an oxidizing atmosphere, dewaxing and firing are carried out in an inert or non-oxidizing atmosphere. The resulting mold is used for the casting of reactive or refractory metals such as zirconium, titanium, or uranium. The method of making these graphite molds is disclosed in U.S. Pat. No. 3,256,574. The concept of coating the inside or article forming surface of a mold with graphite to improve the characteristics of a cast article is disclosed in U.S. Pat. Nos. 2,618,032; 3,401,735; and 3,645,767.

During the casting of turbine blades and vanes from nickel chrome superalloys with ceramic molds made by the lost wax process, defects have occurred at various critical locations in the cast articles. These defects tend to occur at or adjacent to areas where there is a change in the configuration of the cast article. One particular type of defect which occurs in superalloy single crystal castings is a stripe-like condition known as zebra grains. These multiple, parallel, elongated grains tend to occur side by side on horizontal surfaces such as the platforms of single crystal blades or vanes. Of course, various other types of grain defects can occur in single crystal, columnar grained and equiaxed superalloy castings.

During the casting of a single crystal article from a superalloy, a crystal selector is utilized to select one of a plurality of crystals for growth into an article mold cavity. In U.S. Pat. No. 4,550,764 a body of insulation is provided to block the radiation of heat downwardly from a portion of a crystal selector passage to retard the spurious nucleation of crystals in the passage. The crystal selector disclosed in this patent has an upright primary growth passage and a horizontal secondary growth passage which cooperate to form a doubly-oriented single crystal casting. The use of crystal selectors having straight and helical passages is disclosed in U.S. Pat. No. 4,475,582. In U.S. Pat. No. 4,133,368 it is suggested that a helical crystal selector passage could be disposed in a preformed or precast ceramic insert. The insert has a thickness which provides a desired insulating effect in the area of the helical passage to improve thermal gradients and minimize spurious crystal nucleation.

SUMMARY OF THE INVENTION

The present invention minimizes casting defects by applying a coating of a material having a high emissivity over at least a portion of the surface of a ceramic mold. When an article is to be cast in the mold, the mold is positioned in a furnace and heat is radiated from a wall of the furnace to the mold. After molten metal has been poured into the mold, the mold is slowly removed from the furnace. As this occurs, heat is radiated from the coating at a relatively high rate to provide improved thermal gradients in the metal as it solidifies.

In one embodiment of the invention, the coating of material having a high emissivity is applied over only a portion of the surface of the ceramic mold material while leaving other portions of the ceramic mold material exposed. This results in heat being radiated from the coated portion of the mold surface at a greater rate than from the uncoated portion of the mold surface during removal of the mold from the furnace. The location of the coated portion of the mold is selected to improve thermal gradients in critical areas of the mold and cast article. Although other materials could be utilized, it is presently preferred to use graphite to form the coating having a high emissivity.

In another embodiment of the invention, at least a major portion of the outer surface of the mold is covered with the coating of material having a high emissivity. This promotes the absorption of radiation by the mold during heating of the mold and promotes heat radiation from the mold during withdrawal of the mold from a furnace chamber.

In order to cast a single crystal article, a crystal selector may be used to allow only one grain or crystal to grow into an article mold cavity. By coating a portion of a crystal selector with a material having a high emissivity, the radiation of heat from the coated portion of the crystal selector is promoted during withdrawal of the mold from a furnace chamber. The relatively high rate of radiation of heat from the coated portion of the crystal selector causes a grain or crystal adjacent to the coating to solidify faster than grains which are spaced further from the coating. This results in a preferential growth of the grain which is adjacent to the coating. By using a coating of material having a relatively high emissivity on a portion of a crystal selector, the structure of the selector can be simplified.

During solidification of the molten metal in the mold, a solidification zone moves from one end portion of the mold to the opposite end portion of the mold. It is preferred to promote this directional solidification of the molten metal by removing the mold from a furnace chamber. However, if desired, the directional solidification of the molten metal could occur while the mold remains in the furnace chamber.

Accordingly, it is an object of this invention to provide a new and improved method of casting an article and wherein heat is radiated at a relatively high rate from a surface of a coating on a mold during withdrawal of the mold from a furnace chamber.

Another object of this invention is to provide a new and improved method of casting an article and wherein a coating of material having a greater emissivity than ceramic mold material is applied over a portion of the surface of a ceramic mold while another portion of the surface of the ceramic mold is exposed so that heat is radiated from the surface of the coating at a greater rate than the exposed surface of the ceramic mold.

Another object of this invention is to provide a new and improved method of casting a single crystal metal article and wherein a coating of material having a surface with an emissivity which is greater than the emissivity of ceramic mold material is applied over a portion of a crystal selector formed of ceramic mold material so that heat is radiated from the coated portion of the crystal selector at a greater rate than the uncoated portion of the crystal selector.

Another object of this invention is to provide a new and improved method of casting an article and wherein heat is radiated at a relatively high rate from a surface of a coating on a mold during movement of a solidification zone from one end portion of the mold to an opposite end portion of the mold.

BRIEF DESCRIPTION OF THE DRAWINGS

The foregoing and other objects and features of the present invention will become more apparent upon a consideration of the following description taken in connection with the accompanying drawings wherein:

FIG. 1 is a simplified drawing illustrating a metal article cast with the method of the present invention;

FIG. 2 illustrates where a coating having a relatively high emissivity is applied over a portion of a mold in which the article of FIG. 1 is cast;

FIG. 3 is an enlarged fragmentary view of a portion of the mold of FIG. 2 and further illustrating the relationship between the coating and the mold;

FIG. 4 is a schematic illustration depicting the manner in which the mold of FIG. 2 is positioned in the chamber of a furnace prior to pouring of molten metal into the mold;

FIG. 5 is an enlarged fragmentary view illustrating a second embodiment of the invention in which a coating of material having a relatively high emissivity is applied over a plurality of areas on the surface of a mold;

FIG. 6 is a schematic illustration, generally similar to FIG. 4, illustrating the relationship between a mold for a single crystal article and a furnace prior to pouring of molten metal into the mold;

FIG. 7 is an enlarged fragmentary illustration of a portion of the mold of FIG. 6 and schematically illustrating the manner in which a crystal adjacent to a portion of a coating of material of relatively high emissivity grows to crowd out other crystals in a passage of a crystal selector; and FIG. 8 is an illustration, generally similar to FIG. 2, of an embodiment of the invention in which a coating of material having a relatively high emissivity is applied over the entire outer side surface of a mold.

DESCRIPTION OF SPECIFIC PREFERRED EMBODIMENTS OF THE INVENTION

Cast Article

A cast metal turbine blade 10 (FIG. 1) has a blade portion 12 and a root or base portion 14 which are separated by generally rectangular platform 16. The turbine blade 10 is cast as one piece of a nickel chrome superalloy and has a columnar grain crystallographic structure. Although the turbine blade 10 has a columnar grain crystallographic structure, it should be understood that the turbine blade could be formed with a single crystal or equiaxed crystallographic structure.

During casting of the turbine blade 10, defects tend to occur in areas where the cross section of the blade changes. For example, defects tend to occur in the area where the platform extends outwardly from the blade. When a turbine blade is cast as a single crystal, a stripe-like condition known as zebra grains tends to occur on the platform 16. The zebra grains are multiple, parallel elongated grains which occur in a side-by-side relationship. Of course other types of defects tend to occur in other areas on the turbine blade 10.

It should be understood that although the cast article 10 of FIG. 1 is a turbine blade, the method of the present invention can be used during the casting of many different articles, such as a vane, hub or shroud ring. It should also be understood that the method of the present invention can be used to cast articles other than turbine engine components.

Mold

A ceramic mold 20 (FIG. 2) for casting the article 10 includes an article mold cavity 22. The mold cavity 22 has a configuration corresponding to the configuration of the article 10. A base or starter cavity 24 extends upwardly from an opening 26 to the article mold cavity 22. Gating 28, illustrated schematically in FIG. 2, is connected in communication with the upper end portion of the article mold cavity 22. It should also be understood that although only a single mold 20 has been shown in FIG. 2, the mold may be one mold of a plurality of molds which are interconnected in a cluster in a manner similar to that disclosed in U.S. Pat. Nos. 3,680,625 and 3,690,368.

In accordance with one of the features of the invention, at least a portion of an outer side surface 32 of the mold 20 is covered with a coating 34 of material having a greater emissivity than the ceramic material of the mold. When only a portion of the surface 32 of the mold 20 is covered with the coating 34 of material having a relatively high rate of emissivity, the rate of radiation of heat to and from the coated portion of the mold 20 is increased. This is because the emissivity of the coating 34 is greater than the emissivity of the surface 32 of the ceramic material forming the mold 20.

Emissivity is the relative emissive power of a radiating surface expressed as a fraction of the emissive power of a black body radiator at the same temperature. The emissivity of the coating 34 is more than twice as great as the emissivity of the surface 32 of the ceramic mold material. Therefore, under similar conditions, the surface of the coating 34 will absorb and radiate heat at more than twice the rate of the surface 32 of the ceramic mold material.

The thermal properties of the mold 20 are altered by the coating 34. The coating 34 promotes a more uniform heating of the mold 20 during preheating of the mold before molten metal is poured into the mold. In addition, thermal gradients are improved in critical areas of the mold 20 during solidification of molten metal in the mold. It has been speculated that when the coating 34 of high emissivity material is formed of an electrically conductive material, the coating may intercept an electromagnetic field from the coils of a furnace and cause localized heating and minimize or prevent stirring as metal solidifies in the mold. This localized heating and minimization of stirring may occur in such a manner as to minimize the formation of defects in a cast article.

It should be understood that although the coating 34 has been shown in FIG. 2 as being over the portion of the mold 20 in which the root 14 and platform 16 of the article 10 are cast, the coating 34 could be over other portions of the mold if desired. The location of the coating 34 on the outside of the mold 20 for a specific article to be cast, will be determined, in part, by the configuration of the article. Although the portion of the mold 20 in which both the root 14 and platform 16 of the article 10 are cast is covered by the coating 34 in FIG. 2, the coating could be disposed on only the lower side of the platform.

Method of Making Mold

The mold 20 is formed of a ceramic material by what is frequently referred to as the lost wax process. In making the mold 20 a disposable pattern is first formed. The disposable pattern has the same configuration as the interior of the mold 20. Thus, a main portion of the disposable pattern has a configuration corresponding to the configuration of the article mold cavity 22 and the article 10. Other portions of the disposable pattern have configurations corresponding to the configuration of the starter cavity 24 and the passages in the gating 28.

The configuration of the disposable pattern will depend upon the configuration of the article to be cast and the gating associated with the article. The disposable pattern may be formed of a natural or artificial wax, polystyrene or other material. Of course, if a cluster of molds were to be used rather than a single mold, the pattern would have a configuration corresponding to the configuration of the cluster of molds.

A wet coating of ceramic mold material is applied over the pattern. The wet coating of ceramic mold material may be applied over the pattern by dipping, brushing, spraying or other methods. However, it is presently preferred to repetitively dip the pattern in a liquid slurry of ceramic mold material. Although many different types of slurry could be utilized, one illustrative slurry contains fused silica, zircon, or other refractory materials in combination with binders. Chemical binders such as ethyl silicate, sodium silicate and colloidal silica can be utilized. In addition, the slurry may contain suitable film formers such as alginates to control viscosity and wetting agents to control flow characteristics and pattern wettability.

In accordance with common practices, the initial slurry coating applied to the pattern may contain a very finely divided refractory material to produce an accurate surface finish. A typical slurry for a first coat may contain a colloidal silica sol as the binder. Zircon or alumina of a particle size of 325 mesh or smaller as the refractory can be employed, together with less than one-tenth percent by weight of a wetting agent. After the application of the initial coating, the surface is stuccoed with refractory materials having particle sizes on the order of 60 to 200 mesh.

In accordance with well known procedures, each dip coating is dried in air at a temperature of approximately 24° C. before subsequent dipping. The pattern is repetitively dipped and dried enough times to build up a covering a ceramic mold material of a desired thickness. For example, the pattern may be dipped fifteen times to build up a covering of a thickness of approximately 0.400 inches in order to prevent mold bulge.

The wax material of the pattern is then melted and poured from the mold. After the dewaxing, the uncured mold sections are fired in an oxidizing atmosphere at a temperature of more than 540° C. for one hour to thoroughly cure the mold sections, burn any residual pattern material, and drive off any water. It is contemplated that the uncured mold sections may be fired in an oxidizing atmosphere at a temperature of approximately 1,038° C. for approximately one hour. Of course, the specific composition of the slurry of ceramic mold material, number of dip coatings, and firing temperature and time may vary depending upon the construction of the mold.

In accordance with one of the features of the invention, the coating 34 of a material having a surface with a higher emissivity than the surface 32 of the ceramic mold 20 is applied over at least a portion of the surface of the mold. Although the coating 34 may be formed of many different materials, it is preferred to use graphite as the coating material. The coating of graphite may be applied to the outer side surface of the mold by painting or spraying the graphite on the surface of the mold or by dipping the mold in graphite. Since the graphite coating 34 would burn or rapidly oxidize during firing of the mold 20, the graphite coating is applied after the mold has been fired.

The surface of the graphite coating 34 has an emissivity of more than 0.90 at a temperature of approximately 1,000° C. or more. It is believed that the surface 32 of the ceramic mold material, as fired, has an emissivity of approximately 0.28 to 0.39 at a temperature of 1,000° to 1,500° C. Thus, the graphite coating 34 has an emissivity which is more than twice as great as the emissivity of the ceramic material forming the surface 32 of the mold 20.

In the embodiment of the invention illustrated in FIGS. 2 and 3, the graphite coating 34 is applied to the surface 32 of the mold 20 in areas where defects tend to form in an article during casting of the article. The locations of the areas where defects tend to form in a specific article to be cast are determined by casting and inspecting a plurality of articles. Frequently defects tend to occur at locations where the cross sectional area of the cast article changes.

During casting of the turbine blade 10 of FIG. 1, defects tend to occur in or adjacent to the platform 16. To prevent the formation of defects in or adjacent to the platform 16 of the turbine blade 10 (FIG. 1), the coating 34 is applied over a portion 38 (FIG. 3) of the outer side surface 32 of the mold 20 which overlies a portion 40 of the article mold cavity 22 in which the platform 16 and root 14 are cast.

A surface 39 (FIG. 3) of the platform forming portion of the mold 20 is generally horizontal and faces downwardly. The surface 39 forms a generally rectangular ring which extends around a portion 44 of the article mold cavity 22 in which the blade portion 12 of the turbine blade 10 is cast. The graphite coating 34 forms a continuous rectangular ring which extends over the flat mold surface 39. An upper surface 41 of the platform forming portion of the mold 20 is also covered by the graphite coating 34. The part of the mold 20 defining the portion 44 in which the blade 12 is cast has a generally vertically extending outer side surface 46.

The graphite coating 34 could have a configuration other than illustrated in FIGS. 2 and 3. For example, the graphite coating 34 could extend downwardly over the upper end portion of the surface 46 (FIG. 3). The graphite coating could be applied at a plurality of problem areas on the same mold if desired. The location of the problem areas where the graphite coating 34 should be applied depends upon the configuration of a particular article being cast.

The graphite coating 34 is formed by applying a commercially available liquid containing finely divided graphite crystals in a water soluble base with stabilizing additives to the surface 32 of the mold 20. In one particular embodiment of the invention, the graphite coating was "DYLON AE" which can be obtained by Dylon Industries, Inc., 120 First Avenue, Berea, Ohio, U.S.A. "DYLON AE" has the following characteristics:

| | |
|---|---|
| Graphite Content | 22 w/o |
| Vehicle | water, alcohols |
| Binder | fugitive to 250° C. |
| pH | neutral |
| Density | 10 lbs./gal. |

After the mold 20 has been fired, the coating 34 of "DYLON AE" can be applied to the surface 32 of the mold 20 in many different ways. In one specific instance, a coating of "DYLON AE" was applied to the surface area 38 by dipping. This initial coating was stuccoed with graphite particles while the coating was still wet.

The initial coating was then air dried at room temperature. Additional coatings were applied. In this specific instance, three coatings of "DYLON AE" were applied, the first two coats being stuccoed with graphite particles and the last or outer coat being left unstuccoed. The resulting multiple layered coating 34 has a relatively high surface emissivity which is more than twice as great as the surface emissivity of the ceramic material forming the mold 20.

It is preferred to oven dry the coating 34, at a temperature below 300° C., to drive off most volatiles from the coating. If desired, the coating 34 can be formed of a material other than graphite. However, the emissivity of the surface of the coating 34 should be substantially greater than the emissivity of the surface 32 of ceramic material forming the mold.

Casting Article

When the mold 20 is to be used to cast the turbine blade 10 of FIG. 1, a circular chill plate 52 (FIG. 4) on a support shaft 54 is lowered from a furnace 56 by operation of a piston and cylinder type motor (not shown) in a known manner. Once the chill plate 52 has been lowered, the mold 20 is placed in the center of the chill plate. The chill plate 52 is then raised to move the mold 20 into a cylindrical furnace chamber 60.

The entire furnace 56 (FIG. 4) is enclosed in a housing (not shown) which is sealed after the mold 20 has been positioned in the furnace chamber 60. The air is then pumped out of the housing and the furnace 56 to provide a vacuum or nonoxidizing atmosphere in a manner similar to that described in U.S. Pat. No. 3,841,384. However, if desired, the nonoxidizing atmosphere could be obtained by filling the housing and furnace chamber 60 with an inert gas, such as argon.

After the nonoxidizing atmosphere has been provided in the furnace chamber 60, coils 64 of the furnace are energized. Energization of the helical coils 64 causes a cylindrical susceptor wall 66 of the furnace to be heated. Since the susceptor wall 66 surrounds the mold 20, heat is radiated from a cylindrical inner side surface 68 of the susceptor wall to the exposed surface 32 of the ceramic mold 20 and to the outer surface of the coating 34.

The coating 34 of material having a relatively high emissivity, that is graphite, promotes the absorbing of radiation by the portion of the mold 20 upon which the coating is disposed. In the present instance, the coating 34 is disposed on horizontal surface areas 39 and 41 of the portion of the mold in which the platform 16 is to be cast and on the portion of the mold in which the root 14 is to be cast. In the absence of the coating 34, the absorption of radiation by the surface areas 39 and 41 of the mold 20 would be retarded due to the fact the surface areas 39 and 41 extend perpendicular to the inner side surface 68 of the susceptor wall 66 and parallel to the upper side surface of the cold chill plate 52. The provision of the graphite coating 34 on the surface areas 39 and 41 of the mold 20 promote a more uniform heating of the mold 20. Of course, if the coating 34 was provided on other portions of the mold 20, the absorption of radiation by these portions of the mold would be promoted.

The mold 20 is preheated in the furnace 56 to a temperature above the liquid us temperature of the metal to be cast. Since a nickel chrome superalloy is to be cast, the mold was preheated to a temperature of about 1,450° C. At a temperature above 430° C., the graphite coating would be consumed or burned in an oxidizing atmosphere. However, the preheating of the mold 20 takes place in a nonoxidizing atmosphere. Thus, the furnace 56 is enclosed is a housing from which the air has been removed before preheating of the mold 20 begins.

After the mold 20 has been preheated to the desired temperature, molten metal is poured into the gating system 28 through a funnel 72 (FIG. 4) which is aligned with the central axis of the mold 20. During the pouring of the molten metal, the nonoxidizing atmosphere is maintained around the furnace 56 and in the furnace chamber 60. This results in the coating 34 remaining intact at the relatively high temperature at which the molten metal is poured.

After the molten metal has been poured into the mold 20, the mold is withdrawn from the furnace chamber 60. This is accomplished by slowly lowering the chill, plate 52. As the chill plate 52 moves downwardly, the lower end portion of the mold 20 is exposed to the relatively cool environment outside of the furnace chamber 60. The molten metal in the mold cavity 22 solidifies first in the lower end portion of the mold. As the mold is withdrawn from the furnace 56, a generally horizontal solidification zone moves upwardly toward the upper end portion of the mold. The manner in which the solidification zone moves upwardly is generally similar to the disclosure in U.S. Pat. No. 4,609,029, issued Sept. 2, 1986, for Method of Reducing Casting Time.

During initial withdrawal of the mold 20 from the furnace heat is radiated from the surface 32 at the lower end portion of the mold 20 to the relatively cool environment surrounding the mold. At this time, heat is radiated at a relatively low rate from the coating 34 since it is in the hot, upper portion of the furnace chamber 60. Therefore, the molten metal in the lower end portion of the mold cavity solidifies before the molten metal in the upper end portion of the mold cavity.

During continued withdrawal of the mold 20 from the furnace chamber 60, the coating 34 becomes exposed to the relatively cool environment outside of the furnace chamber. Therefore, heat is radiated from the surface of the coating 34 to the relatively cool environment outside the furnace chamber. The rate at which heat is radiated from the surface of the coating 34 is promoted by the relatively high emissivity of the coating 34.

Since the surface of the graphite coating 34 has an emissivity which is at least twice as great as the emissivity of the ceramic mold surface 32, heat is radiated at a greater rate from the surface of the coating 34 than from the adjacent surface of the ceramic mold material. The rate of radiation of heat from the surface of the coating 34 is at least twice as great as would be the rate of radiation from the surfaces 39 and 41 of the mold in the absence of the coating 34. The mold 20 remains in the nonoxidizing atmosphere contained in the housing which surrounds the furnace 56 until after the mold has been completely withdrawn from the furnace chamber 60. This prevents burning or rapid oxidation of the coating 34 before the mold 20 has been completely withdrawn from the furnace chamber 60.

As the mold 20 is slowly withdrawn from the furnace chamber 60 and heat is radiated from the exposed portion of the surface 32 of the mold and from the surface of the coating 34, the metal in the mold solidifies, at a slowly upwardly moving solidification zone, with the desired crystallographic structure. In the case of the mold 20, the molten metal solidifies with a columnar grain crystallographic structure. However, the mold 20 could be used to cast an article with an equiaxed grain structure if desired.

Due to the increased rate of radiation from the coating 34 on the surfaces 39 and 41 of the platform forming area of the mold 20, defects which would occur in the platform 16 of the article 10, in the absence of the coating 34, are avoided. This is due, in part at least, to improved thermal gradients in the critical areas of the article 10 around the platform 16 as the molten metal solidifies. It is speculated that the graphite coating 34 may intercept an electromagnetic field from the coils 64 and cause localized heating and minimal stirring of the molten metal immediately prior to and during solidification of the molten metal.

Although it is preferred to effect upward movement of the solidification zone in the article mold cavity 22 by slowly withdrawing the mold from the furnace chamber 60, movement of the solidification zone from one end portion of the article mold cavity 22 to the opposite end portion of the article mold cavity could be obtained in other ways if desired. For example, the furnace could be constructed in a manner similar to the disclosures in U.S. Pat. Nos. 3,346,039; 3,376,915; and 3,405,220 to have a plurality of coils which are separately controlled. The mold 20 could then be held stationary in a furnace chamber and the electrical energy conducted to the coils varied to cause a horizontal solidification zone to move upwardly from the lower end of the stationary mold to the upper end of the mold.

Second Embodiment

In the embodiment of the invention illustrated in FIGS. 1–4, the graphite coating 34 is applied to the surfaces 39 and 41 which overly the platform forming portion 40 of the mold cavity 22 (see FIG. 3). In the embodiment of the invention illustrated in FIG. 5, the graphite coating has two sections, that is a section which is disposed on the platform forming portion of the mold and a section which is disposed on the blade forming portion of the mold. Since the embodiment of the invention illustrated in FIG. 5 is generally similar to the embodiment of the invention illustrated in FIGS. 1–4, similar numerals will be utilized to designate similar components, the suffix letter "a" being associated with the numerals of FIG. 5 in order to avoid confusion.

The mold 20a has an article mold cavity 22a with a platform forming portion 40a and a blade forming portion 44a. A section 76 of a graphite coating 34a is disposed on the surface 39a of the mold outside of the platform forming portion 40a of the mold cavity 22a. In this particular mold, it was decided that it was not necessary to coat the upper side surface 41a of the platform forming portion 40a. In addition, the portion of the mold 20a in which the root 14 (FIG. 1) of the blade 10 is cast was not covered by the graphite coating 34a (FIG. 5).

A second section 78 (FIG. 5) of the graphite coating 34a is disposed outside of a generally vertical portion 44a of the article mold 22a in which the blade portion 12 of the turbine blade 10 is formed. The two sections 76 and 78 of the coating 34a are spaced apart from and extend generally perpendicular to each other. Although the second section 78 of the coating 34a has been shown in FIG. 5 as being disposed over the blade forming portion 44a of the article mold cavity 22a, it should be understood that the second section 78 of the coating 34a could be in any critical location on a mold for a particular article to be cast. Of course, the two sections 76 and 78 of the coating 34a may be disposed in any desired spatial orientation relative to each other in order to eliminate a specific problem in a specific casting.

Single Crystal

In making a single crystal castings, grain defects can result in rejection of the castings. One common type of grain defect that can occur on superalloy single crystal castings is a stripe-like condition known as zebra grains. These are multiple, parallel elongated grains which occur side by side on horizontal surfaces such as the platforms of blades and vanes. They are considered defects in single crystal castings and constitute a cause for rejection. Of course, other known types of grain defects can occur. A coating of material having a relatively high emissivity can be used in association with a mold for a single crystal article to eliminate many different defects, including zebra grains.

A mold for a single crystal article is illustrated in association with a furnace in FIG. 6. A portion of the mold of FIG. 6 is shown in FIG. 7. Since the mold and furnace of FIGS. 6 and 7 are generally similar to the mold and furnace shown in FIGS. 2–4, similar numerals will be utilized to designate similar components, the suffix letter "b" being associated with FIGS. 6 and 7 in order to avoid confusion.

A ceramic mold 20b for casting a single crystal turbine blade, corresponding to the turbine blade 10 of FIG. 1, as a main portion in which an article mold cavity 22b is disposed. Gating 28b is connected with the upper end portion of the article mold cavity. A crystal selector 82 is connected with the lower end portion of the article mold cavity 22b.

The mold 20b is formed as one piece by repetitively dipping a disposable pattern in a slurry of ceramic mold material in the manner previously explained in conjunction with the embodiment of the invention shown in FIGS. 1–4. The resulting coating of ceramic mold material is dewaxed and then fired in an oxidizing atmosphere at a temperature of more than 540° C., specifically at a temperature of approximately 1,038° C. Of course, the disposable pattern has a main portion with a configuration corresponding to the configuration of the article mold cavity 22b, a gating portion with a configuration corresponding to a passage through the gating portion 28b, and a selector portion having a configuration corresponding to the configuration of a passage in the crystal selector 82.

When the ceramic mold 20b is to be used to cast an article, the chill plate 52b is lowered and the mold is positioned on the chill plate. The chill plate is then raised to position the mold 20b in the cylindrical furnace chamber 60b. A housing (not shown) enclosing the furnace 56b is then evacuated to provide a nonoxidizing atmosphere. After the furnace chamber 60b has been evacuated, the mold 20b is preheated to a temperature above the liquidus temperature of the metal to be cast. Although the preheat temperature will vary depending upon the composition of the metal alloy to be cast, it is contemplated that the preheat temperature may be approximately 1500° C. A flow of molten metal is then conducted through the funnel 72b into the gating 28b and downwardly through the article mold cavity 22b to the crystal selector 82. The molten metal may be a nickel chrome super alloy.

After the mold 20b has been filled with molten metal, the chill plate 52b is slowly lowered and the mold is withdrawn from the furnace chamber 60b. As the mold 20b is gradually withdrawn from the furnace chamber 60b, a generally horizontal solidification zone moves upwardly in the mold cavity 22b. As this occurs, a single crystal of metal grows upwardly from the selector 82 into the article mold cavity 22b. The single crystal of metal grows upwardly into the article mold cavity 22b to the gating system 28b. In the gating system 28b, there maybe spurious nucleation with a few additional crystals so that the single crystal structure of the cast article may stop just past the upper end of the article mold cavity 22b.

Although it is preferred to withdraw the mold 20b from the furnace chamber 60b to cause a generally horizontal solidification zone to move upwardly from the lower end portion of the mold to the upper end portion of the mold, the mold could be maintained stationary in the furnace chamber. If this was done, a plurality of separate coils would be substituted for the single coil 64b in the manner disclosed in U.S. Pat. Nos. 3,346,039; 3,376,915: and 3,405,220. The electrical energy to the lower coils would be gradually reduced and then terminated to cause the horizontal solidification zone to move slowly upwardly through the stationary mold cavity 22b.

In accordance with one of the features of the invention, a coating 34b of material having a high emissivity is provided on a downwardly facing side surface 39b of the platform forming portion of the article mold 20b. The coating 34b has an emissivity which is at least twice as great as the emissivity of the surface 32b of the ceramic material forming the mold 20b. The coating 34b is formed of graphite in the manner described in conjunction with the coating 34 of FIGS. 2-4.

The exact manner by which the graphite coating 34b functions to improve grain growth control and eliminate zebra grains has not been established. It is believed that the graphite coating 34b alters the thermal properties of the mold, such as its thermal conductivity and emissivity, to provide more uniform heating and improved gradients in a critical area. In the embodiment of the invention illustrated in FIG. 6, the critical area is the platform of a single crystal turbine blade. Of course, the coating 34b could be applied to other areas of the mold 20b if desired.

In accordance with another feature of the invention, a coating 86 (FIGS. 6 and 7) is provided on a portion of the outer side surface of the ceramic mold material forming the crystal selector 82. The coating 86 extends only part way around the selector 82. The coating 86 has an emissivity which is at least twice as great as the emissivity of the ceramic mold material forming the crystal selector 82. In one specific embodiment of the invention, the coating 86 was of graphite and was applied in the same manner as explained in conjunction with the coating 34 of FIGS. 2-4.

When the mold 20b is lowered out of the furnace, a plurality of grains 87, 88, 90, 92, 94, 96, 98 and 100 grow upwardly from the flat upper side surface 102 of the chill plate 52b (see FIG. 7). During initial growth of the grains 87-100, heat is conducted straight downwardly to the chill plate 52b. This results in the single crystal grains 87-100 growing straight upwardly from the horizontal upper surface 102 of the chill plate 52b.

As the mold 20b continues to be withdrawn from the furnace chamber 60b, the horizontal solidification front of the single crystal grains 87-100 in the crystal selector 82 approaches the lower edge of the coating 86 of high emissivity material. Due to the relatively high emissivity of the coating 86, heat is radiated at a greater rate from the portion of the crystal selector 82 upon which the coating is disposed than from the opposite side portion of the crystal selector which is not covered by the coating 86. Therefore, the portion of the crystal selector 82 upon which the coating 86 is disposed is cooled faster than the other portions of the crystal selector.

Since heat is radiated at a relatively high rate from the coating 86, the grain 100 which is closest to the coating 86 grows at a faster rate than the other grains 87-98. As heat is conducted sidewardly from the grain 100, the grain solidifies sidewardly in the opposite direction and crowds the other grains 87-98. This results in the grain 100 expanding in size until it extends clear across a passage 110 in the crystal selector 82. The growth of the grains 87-98 is terminated in the crystal selector 82 in the manner shown schematically in FIG. 7.

The coating 86 of material having a relatively high emissivity, that is graphite, is shown in conjunction with one particular crystal selector 82. However, it is contemplated that a coating of high emissivity material, corresponding to the coating 86, could be used with many different types of crystal selectors such as the crystal selectors disclosed in U.S. Pat. Nos. 3,494,709; 4,180,119; 4,475,582; and 4,550,764.

In accordance with another feature of the invention, the crystal selector 82 has a straight passage 110 in which a single crystal 100 is selected for growth into the article mold cavity 22b. The straight passage 110 is relatively easy to form in conjunction with the article mold cavity 22b. Thus, a pattern for the mold 20b (FIG. 6) would merely have a straight extension from the portion of the pattern having a configuration corresponding to the configuration of a turbine blade and the article mold cavity 22b.

In the illustrated embodiment of the invention, the selector passage 110 has a cylindrical configuration and extends straight upwardly from the chill plate to an opening leading to the article mold cavity 22b. The vertical longitudinal central axis of the selector passage 110 is coincident with a central axis of the article mold cavity 22b (FIG. 6) and extends perpendicular to the upper side surface 102 of the chill plate 52b. A disposable pattern used to form the cylindrical passage 110 would have a cylindrical projection which is connected with one end of the main portion of the pattern.

The coating 86 of material having a surface of relatively high emissivity, that is graphite, is applied to only one side of the cylindrical outer surface 114 of the crystal selector 82. The coating 86 does not extend around the cylindrical crystal selector 82. The coating has an arcuate extent of 20° to 40° about the vertical central axis of the crystal selector 82. This is done so that the relatively high rate of radiation of heat from the coating 86 is effective to primarily promote the growth of the single crystal grain 100 which is closest to the coating as heat is radiated at a relatively high rate from the coating.

The coating 86 is spaced upwardly from the lower end of the selector 82. Therefore, a plurality of single crystal grains 88–100 grow straight upwardly from a circular opening 118 at which the upper side surface 102 of the chill plate is exposed to the molten metal at the bottom of the passage 110 in the crystal selector 82. However, the surface of the coating 86 radiates heat a greater rate than the surface 114 of ceramic material exposed on the remainder of the crystal selector 82. Therefore, as the crystal selector is withdrawn from the furnace, the portion of the crystal selector upon which the coating 86 is disposed is relatively cool.

Since the single crystal grain 100 is closest to the graphite coating 86, the grain 100 solidifies or grows faster than the other grains 87–98. Due to the sideward extraction of heat from the crystal selector 82 at a relatively high rate at the coating 86, the solidification front in the crystal selector is tilted from a horizontal orientation in a direction away from the portion of the crystal selector upon which the coating 86 is disposed. The high rate of cooling the grain 100 which is closest to the coating 86, results in preferential growth of this grain. Therefore, the grain 100 grows faster than the other grains 87–98 and crowds them out in the manner which has been illustrated schematically in FIG. 7. Only the single crystal grain 100 emerges from the crystal selector 82 and grows into the article mold cavity 22b. This results in the formation of a single crystal article in the article mold cavity 22b.

It should be understood that the coating 86 on the crystal selector 82 could be used without having a coating 34b (FIG. 6) on another portion of the mold 20b. It should also be understood that the crystal selector 82 can be used in the casting of articles other than a turbine blade.

Fourth Embodiment

In the embodiments of the invention illustrated in FIGS. 2–7, a coating of material having a relatively high emissivity has been placed only over selected portions of the exterior surface of a ceramic mold. In the embodiment of the invention illustrated in FIG. 8, the coating of material having a high emissivity covers the entire exterior surface of the mold. Since the embodiment of the invention illustrated in FIG. 8 is generally similar to the embodiment of the invention illustrated in FIGS. 1–7, similar numerals will be utilized to designate similar components, the suffix letter "c" being associated with the embodiment of the invention illustrated in FIG. 8 to avoid confusion.

A ceramic mold 20c has an article mold cavity 22c and a starter cavity 24c at an open end 26c. To form the mold 20c, a disposable pattern having a configuration corresponding to the configuration of the article mold cavity 22c, starter cavity 24c and the passage in the gating 28c is formed. This pattern is repetitively dipped in ceramic mold material in the manner previously explained. After the coating of ceramic mold material has been dried and the disposable pattern removed by a dewaxing process, the ceramic mold is fired in an oxidizing atmosphere.

After the mold 20c has been fired, a coating 126 is applied over the entire exterior surface 34c of the ceramic mold material. The emissivity of the surface of the coating 126 is more than twice as great as the emissivity of the surface 34c of the ceramic mold material. Therefore, heat is radiated from the coating 126 at a substantially greater rate than heat would be radiated from the surface 32c of the ceramic mold material in the absence of the coating.

To apply the coating 126 over the outside of the ceramic mold 20c, one end of the mold is closed or sealed. Thus, the open end of the gating 28c could be taped or suitably sealed. The opening 26c at the opposite end of the mold may also be sealed to prevent the material forming the coating 126 from entering the mold cavity 22c.

After both ends of the mold 20c have been sealed, the coating 126 of material having a relatively high emissivity, that is an emissivity which is more than twice as great as the emissivity of the ceramic mold material, is applied to the outer surface 34c of the mold 20c. The coating 126 may be applied to the outer surface 34c of the mold 20c by repetitively dipping the mold in the material, by spraying the mold or by painting the material onto the mold.

It is presently preferred to apply a coating 126 of graphite to the outer surface 34c of the mold 20c by repetitively dipping the mold in a graphite compound which is a suspension of finely divided graphite crystals with special stabilizing and protective additives, in a water soluble base. Such a graphite compound is sold under the trademark "DYLON AE" by Dylon Industries, Inc. of 120 First Avenue, Berea, Ohio, U.S.A. In applying the coating, the ceramic mold 20c is dipped twice. After each dipping, the wet coating of graphite is stuccoed with graphite particles. The mold is then dipped a third time to apply an outer coating which is left unstuccoed.

By applying the coating 126 over the entire outer side surface 34c of the mold 20c, the absorbation of heat by the mold and the radiation of heat from the mold is promoted. Therefore, the mold 20c heats to a desired temperature in less time during preheating of the mold. This reduces the amount of furnace time required to preheat the mold. In addition, the improved absorption and radiation of heat makes heat management easier, that is, it is easier to control heat input and output to obtain a desired temperature condition in a mold.

Conclusion

In view of the foregoing description, it is apparent that the present invention provides a new and improved method which minimizes casting defects by applying a coating 34 of a material having a high emissivity over at least a portion of the surface 32 of a ceramic mold 20. When an article is to be cast in the mold 20, the mold is positioned in a furnace 56 and heat is radiated from a wall 66 of the furnace to the mold. After molten metal has been poured into the mold 20, the mold is slowly removed rom the furnace 56. As this occurs, heat is radiated from the coating 34 at a relatively high rate to provide improved thermal gradients in the metal as it solidifies.

In one embodiment of the invention (FIGS. 2–4), the coating 34 of material having a high emissivity is applied over only a portion of the surface 32 of the ceramic mold material while leaving other portions of the ceramic mold material exposed. This results in heat being radiated from the coated portion of the mold surface at a greater rate than from the uncoated portion of the mold surface during removal of the mold from the furnace 56. The location of the coated portion 34 of the mold 20 is selected to improve thermal gradients in critical areas of the mold and cast article. Although other materials could be utilized, it is presently preferred to use graphite to form the coating 34 having a high emissivity.

In another embodiment of the invention (FIG. 8), at least a major portion of the outer surface 32c of the mold 20c is covered with the coating 34c of material having a high emissivity. This promotes the absorption of radiation by the mold 20c during heating of the mold and promotes heat radiation from the mold during withdrawal of the mold from a furnace chamber.

In order to cast a single crystal article (FIGS. 6 and 7), a crystal selector 82 may be used to allow only one grain or crystal 100 to grow into an article mold cavity 22b. By coating a portion of a crystal selector 82 with graphite or other material having a high emissivity, the radiation of heat from the coated portion 86 of the crystal selector 82 is promoted during withdrawal of the mold from a furnace chamber. The relatively high rate of radiation of heat from the coated portion 86 of the crystal selector 82 causes a grain or crystal 100 adjacent to the coating to solidify faster than grains 87–98 which are spaced further from the coating. This results in a preferential growth of the grain 100 which is adjacent to the coating 86. By using a coating 86 of material having a relatively high emissivity on a portion of a crystal selector 82, the structure of the selector can be simplified.

During solidification of the molten metal in the mold 20, 20a, 20b, or 20c, a generally horizontal solidification zone moves from one end portion of the mold to the opposite end portion of the mold. It is preferred to promote this directional solidification of the molten metal by removing the mold from a furnace chamber 60 or 60b. However, the directional solidification of the molten metal could occur while the mold remains in the furnace chamber.

Having described specific preferred embodiments of the invention, the following is claimed:

1. A method of casting an article, said method comprising the steps of forming a mold having an inner surface with a configuration corresponding to the configuration of the article to be cast and an outer surface with a first surface area having a first emissivity and a second surface area having a second emissivity which is at least twice as great as the first emissivity, positioning the mold in a furnace chamber, radiating heat from a wall of the furnace chamber to the first and second surface areas on the mold, flowing molten metal into the mold, thereafter, removing the mold from the furnace chamber, and radiating heat from the second surface area during said step of removing the mold from the furnace chamber.

2. A method as set forth in claim 1 wherein said step of forming a mold includes forming an uncured ceramic mold, firing the ceramic mold in an oxidizing atmosphere at a temperature above 540° C., and, thereafter, applying a coating containing graphite over a portion of the surface of the ceramic mold to form the second surface area.

3. A method as set forth in claim 1 wherein said step of forming a mold includes forming a ceramic mold with an outer surface having the first emissivity, and, thereafter, applying a coating over a portion of the outer surface of the ceramic mold to form the second surface area having the second emissivity.

4. A method as set forth in claim 3 wherein said step of applying a coating over a portion of the outer surface of the ceramic mold includes applying a coating containing graphite over a portion of the outer surface of the ceramic mold.

5. A method as set forth in claim 1 wherein at least a major portion of the article is cast as a single crystal of metal, said step of forming a mold including forming a ceramic mold with a first portion having an article mold cavity with a configuration of the article to be cast and a second portion having a passage for use in selecting a single crystal for growth into the article mold cavity, the second surface area being at least partially disposed on the second portion of the mold.

6. A method as set forth in claim 1 wherein said step of forming a mold includes forming a mold with a main portion containing an article mold cavity with a configuration corresponding to the configuration of the article to be cast and a crystal selector portion containing a passage which is connected in communication with the article mold cavity, said first surface area extending over part of the crystal selector portion of the mold and said second surface area extending over another part of the crystal selector portion of the mold, said method further including growing a single crystal of metal from said passage in said crystal selector into the article mold cavity and solidifying at least a major portion of the molten metal in the article mold cavity as a single crystal of metal.

7. A method as set forth in claim 6 wherein said step of forming a mold includes forming the main portion and crystal selector portion of the mold with an outer surface having the first emissivity, and, thereafter, applying a coating over part of the crystal selector portion of the outer surface of the ceramic mold to at least partially form the second surface area having the second emissivity.

8. A method as set forth in claim 7 wherein said step of applying a coating over part of the crystal selector portion of the outer surface of the ceramic mold includes applying a coating containing graphite over part of the crystal selector portion of the ceramic mold.

9. A method as set forth in claim 7 wherein said step of forming a mold further includes applying a coating over part of the main portion of the outer surface of the ceramic mold to partially form the second surface area having the second emissivity.

10. A method of casting an article having transversely extending surface areas, said method comprising the steps of forming a ceramic mold having an outer surface with a first surface area and a second surface area which extends transversely to the first surface area, said step of forming a ceramic mold including the steps of providing a disposable pattern at least a portion of which has a configuration corresponding to the configuration of the article to be cast and having transversely extending surface areas, applying a wet coating of ceramic mold material over the pattern, at least partially drying the wet coating of ceramic mold material, and removing the pattern from within the dried ceramic mold material, thereafter, forming the first surface area on the outer surface of the mold by applying a coating of material having a greater emissivity than the dried ceramic mold material over a portion of the surface of the dried ceramic mold material while leaving another portion of the dried ceramic mold material exposed to form the second surface area on the outer surface of the mold, positioning the mold in a furnace chamber with the first surface area on the outer surface of the mold in a different orientation relative to an inner side surface of a wall of the furnace chamber than the second surface area on the mold, radiating heat from the inner side surface of the wall of the furnace chamber to the first and second surface areas on the outer surface of the mold while the first and second surface areas are in different orientations relative to the inner side surface of the wall of the furnace chamber, said step of radiating heat to the first area on the outer surface of the mold including radiating heat to the surface of the coating of material having a greater emissivity than the dried ceramic mold material, said step of radiating heat to the second area on the outer surface of the mold including radiating heat to the surface of the dried ceramic mold material, flowing molten metal into the mold, thereafter, removing the mold from the furnace chamber, and radiating heat from the first and second surface areas on the outer surface of the mold during performance of said step of removing the mold from the furnace chamber.

11. A method as set forth in claim 10 wherein said step of applying a coating of material having a greater emissivity than the dried ceramic mold material over a portion of the mold includes applying a coating containing graphite over a portion of the mold.

12. A method as set forth in claim 10 wherein the step of radiating heat from the first and second surface areas during removing of the mold from the furnace chamber includes radiating heat from the first surface area at a greater rate than from the second surface area.

13. A method as set forth in claim 10 wherein the first surface area has an emissivity which is at least twice as great as the emissivity of the second surface area.

14. A method as set forth in claim 10 wherein said step of positioning the mold in the furnace chamber includes positioning the mold in the furnace chamber with the first surface area facing downwardly and with the second surface area facing sidewardly in a direction transverse to the first surface area.

15. A method of casting a metal article at least a major portion of which is formed as a single crystal of metal, said method comprising the steps of providing a mold formed of a ceramic material and having a main portion containing an article mold cavity and a crystal selector containing a passage which is connected in communication with the article mold cavity, applying a coating of material having a surface with a greater emissivity than the ceramic material of the mold over a first portion of the crystal selector while leaving the ceramic material of a second portion of the crystal selector exposed, positioning the mold in a furnace chamber, radiating heat from a wall of the furnace chamber to the mold, flowing molten metal into the mold, removing the mold from the furnace chamber, radiating heat from the coating over the first portion of the crystal selector at a greater rate than from the second portion of the crystal selector, and growing a single crystal of metal from the passage in the crystal selector into the article mold cavity.

16. A method as set forth in claim 15 wherein said step of applying a coating over the first portion of the crystal selector includes applying a coating having a surface with an emissivity which is at least twice as great as the emissivity of the surface of the ceramic material forming the second portion of the selector.

17. A method as set forth in claim 15 wherein said step of providing a mold includes the steps of providing a disposable pattern a first portion of which has a configuration corresponding to the configuration of the article mold cavity and a second portion of which has a configuration corresponding to the configuration of the passage in the crystal selector, applying a wet coating of ceramic mold material over the pattern, at least partially drying the wet coating of ceramic mold material, and removing the pattern from within the dried ceramic mold material, said step of applying a coating of material over a first portion of the crystal selector being performed after having performed said step of removing the pattern from within the dried ceramic mold material.

18. A method as set forth in claim 15 wherein said step of growing a single crystal of metal from the passage in the crystal selector into the article mold cavity includes growing a crystal from a portion of the passage adjacent to the first portion of the crystal selector and the coating of material into the article mold cavity and terminating the growth of a crystal in a portion of the passage adjacent to the second portion of the crystal selector.

19. A method as set forth in claim 15 wherein the passage in the crystal selector has a straight longitudinal central axis, said step of growing a single crystal of metal including conducting heat from molten metal in the passage downwardly and in a direction which extends generally parallel to the longitudinal central axis of the passage to grow a plurality of single crystal grains upwardly in the passage, and, thereafter, conducting heat from molten metal in the passage downwardly and in a direction which extends transverse to the longitudinal central axis of the passage to grow only one of the plurality of single crystal grains from an upper end portion of the passage.

20. A method as set forth in claim 15 wherein said step of growing a single crystal of metal includes conducting more heat from the molten metal in the passage in a direction toward the coating of material over the first portion of the crystal selector than in a direction toward the second portion of the crystal selector.

21. A method as set forth in claim 15 further including the steps of positioning the mold on a chill plate with a lower end portion of the crystal selector adjacent to the chill plate, said step of applying a coating of material over the first portion of the crystal selector including applying the coating to the crystal selector at a location disposed above the lower end portion of the crystal selector to leave the ceramic material of the crystal selector exposed on the lower end portion of the crystal selector.

22. A method as set forth in claim 15 further including applying a coating of material having a surface with a greater emissivity than the ceramic material of the mold over a portion of the main portion of the mold.

23. A method as set forth in claim 15 wherein said step of providing a mold includes forming an uncured ceramic mold, firing the ceramic mold in an oxidizing atmosphere at a temperature above 540° C., and, thereafter, performing said step of applying a coating of material over the first portion of the crystal selector.

24. A method as set forth in claim 15 wherein said step of applying a coating of material over a first portion of the crystal selector includes applying a coating containing graphite over the first portion of the crystal selector.

25. A method of casting a metal article at least a major portion of which is formed as a single crystal of metal, said method comprising the steps of providing a mold having a main portion containing an article mold cavity and a crystal selector containing a passage which is connected in communication with the article mold cavity, positioning the mold in a furnace chamber, radiating heat from a wall of the furnace chamber to the mold, flowing molten metal into the mold, removing the mold from the furnace chamber, radiating heat from a first side portion of the crystal selector at a first rate, radiating heat from a second side portion of the crystal selector which is opposite from the first side portion at a second rate which is less than the first rate, growing a plurality of single crystal grains of metal in the passage in the crystal selector, said step of growing a plurality of single crystal grains including growing one single crystal grain adjacent to the first side portion of the crystal selector at a rate which is greater than the rate of growth of any of the other grains, and growing said one single crystal grain from the passage in the crystal selector into the article mold cavity.

26. A method as set forth in claim 25 wherein said step of growing one single crystal grain at a rate which is greater than the rate of growth of any of the other single crystal grains includes growing the one single crystal grain upwardly toward the article mold cavity and sidewardly toward the second side portion of the crystal selector until the one single crystal grain extends across the passage in the crystal selector, thereafter, performing said step of growing the one single crystal grain from the passage in the crystal selector into the article mold cavity.

27. A method as set forth in claim 25 wherein said step of providing a mold includes applying to the first side portion of the crystal selector a coating of material having a surface with a greater emissivity than the surface of the second side portion of the crystal selector while leaving the surface of the second side portion of the crystal selector exposed.

28. A method as set forth in claim 25 wherein said step of providing a mold includes providing a mold in which the first side portion of the crystal selector has a surface with an emissivity which is a least twice as great as the emissivity of the surface of the second side portion of the crystal selector.

29. A method as set forth in claim 25 wherein said step of providing a mold includes forming an uncured ceramic mold, firing the ceramic mold in an oxidizing atmosphere at a temperature above 430° C., and, thereafter, applying a coating containing graphite over the first side portion of the crystal selector.

30. A method as set forth in claim 25 wherein said step of providing a mold includes providing a disposable pattern having a main portion with a configuration corresponding to the configuration of the article mold cavity and a secondary portion which is connected with the main portion and has a configuration corresponding to the configuration of the passage in the crystal selector, applying a wet coating of ceramic mold material over the pattern, at least partially drying the wet coating of ceramic mold material, removing the pattern from within the dried ceramic mold material, and, thereafter, applying a coating of material having a greater emissivity than the dried ceramic mold material over the first portion of the crystal selector while leaving the dried ceramic mold material exposed at the second portion of the crystal selector.

31. A method of casting an article, said method comprising the steps of forming a mold of ceramic material, applying a coating of graphite over a first portion of an outer surface of the mold while leaving the ceramic material of a second portion of the outer surface of the mold exposed, positioning the mold in a furnace chamber, flowing molten metal into the mold, removing the mold from the furnace chamber, and radiating heat from the coating of graphite over the first portion of the outer surface of the mold at a greater rate than from the surface of the exposed ceramic material of the second portion of the outer surface of the mold during said step of removing the mold from the furnace chamber.

32. A method as set forth in claim 31 wherein at least a major portion of the article is formed of a single crystal of metal, said step of forming a mold of ceramic material includes forming a ceramic mold having a main portion containing an article mold cavity and a crystal selector containing a passage which is connected in communication with the article mold cavity, said step of applying a coating of graphite over a first portion of an outer surface of the mold includes applying a coating of graphite a first portion of the crystal selector, said step of leaving the ceramic material of a second portion of the outer surface of the mold exposed includes leaving the ceramic material of a second portion of the crystal selector exposed.

33. A method as set forth in claim 31 wherein said step of providing a mold includes the steps of providing a disposable pattern which has a configuration corresponding to the configuration of the article to be cast, applying a wet coating of ceramic mold material over the pattern, at least partially drying the wet coating of ceramic mold material in an oxidizing atmosphere, and removing the pattern from within the dried ceramic mold material in an oxidizing atmosphere, said step of applying a coating of graphite over a first portion of the outer surface of the mold being performed after having performed said steps of drying the wet coating of ceramic mold material and removing the pattern from within the dried ceramic mold material.

34. A method of casting an article, said method comprising the steps of forming a mold having an inner surface with a configuration corresponding to the configuration of the article to be cast and an outer surface with a first surface area having a first emissivity and a second surface area having a second emissivity which is at least twice as great as the first emissivity, positioning the mold in a furnace chamber, radiating heat from a wall of the furnace chamber to the first and second surface areas on the mold, flowing molten metal into the mold, thereafter, solidifying the molten metal in the mold by causing a solidification zone to move from one end portion of the mold to an opposite end portion of the mold, and radiating heat from the second surface area during said step of solidifying the molten metal in the mold.

35. A method as set forth in claim 34 wherein said step of causing a solidification zone to move from one end portion of the mold to an opposite end portion of the mold includes removing the mold from the furnace chamber.

36. A method as set forth in claim 34 wherein said step of forming a mold includes forming an uncured ceramic mold, firing the ceramic mold in an oxidizing atmosphere at a temperature above 540° C., and, thereafter, applying a coating containing graphite over a portion of the surface of the ceramic mold to form the second surface area.

37. A method as set forth in claim 34 wherein said step of forming a mold includes forming a ceramic mold with an outer surface having the first emissivity, and, thereafter, applying a coating over a portion of the outer surface of the ceramic mold to form the second surface area having the second emissivity.

38. A method as set forth in claim 37 wherein said step of applying a coating over a portion of the outer surface of the ceramic mold includes applying a coating containing graphite over a portion of the outer surface of the ceramic mold.

39. A method as set forth in claim 34 wherein said step of solidifying molten metal in the mold is performed with the mold in the furnace chamber.

40. A method as set forth in claim 34 wherein at least a major portion of the article is cast as a single crystal of metal, said step of forming a mold including forming a ceramic mold with an article mold cavity having a configuration of the article to be cast and with a passage in the one end portion of the mold for use in selecting a single crystal for growth into the article mold cavity, the second surface area being at least partially disposed on the one end portion of the mold, said step of solidifying the molten metal including solidifying the molten metal in the passage prior to solidification of the molten metal in the mold cavity.

41. A method as set forth in claim 34 wherein said step of forming a mold includes forming a mold with a main portion containing an article mold cavity with a configuration corresponding to the configuration of the article to be cast and a crystal selector portion containing a passage which is connected in communication with the article mold cavity, said first surface area extending over part of the crystal selector portion of the mold and said second surface area extending over another part of the crystal selector portion of the mold, said step of solidifying the molten metal including growing a single crystal of metal from said passage in said crystal selector into the article mold cavity and, thereafter, solidifying at least a major portion of the molten metal in the article mold cavity as a single crystal of metal.

42. A method as set forth in claim 41 wherein said step of forming a mold includes forming the main portion and crystal selector portion of the mold with an outer surface having the first emissivity and, thereafter, applying a coating over part of the crystal selector portion of the outer surface of the ceramic mold to at least partially form the second surface area having the second emissivity.

43. A method as set forth in claim 42 wherein said step of applying a coating over part of the crystal selector portion of the outer surface of the ceramic mold includes applying a coating containing graphite over part of the crystal selector portion of the ceramic mold.

44. A method as set forth in claim 42 wherein said step of forming a mold further includes applying a coating over part of the main portion of the outer surface of the ceramic mold to partially form the second surface area having the second emissivity.

45. A method of casting a metal article at least a major portion of which is formed as a single crystal of metal, said method comprising the steps of providing a mold having a main portion containing an article mold cavity and a crystal selector containing a passage which has a straight longitudinal central axis and which is connected in communication with the article mold cavity, positioning the mold in a furnace chamber, flowing molten metal into the mold, removing the mold from the furnace chamber, and growing a single crystal of metal from the passage in the single crystal selector into the article mold cavity, said step of growing a single crystal of metal including first conducting heat from molten metal in the passage downwardly and in a direction which extends generally parallel to the straight longitudinal central axis of the passage to initially grow a plurality of single crystal grains upwardly in the passage, and thereafter, conducting heat from molten metal in the passage downwardly and in a direction which extends transverse to the straight longitudinal central axis of the passage to grow only one of the plurality of single crystal grains to an upper end of the passage, said step of conducting heat downwardly and in a direction which extends transverse to the straight longitudinal central axis of the passage includes conducting heat from a portion of the molten metal disposed to one side of the straight longitudinal central axis at a greater rate than from the molten metal disposed to a side of the straight longitudinal central axis opposite from the one side.

46. A method as set forth in claim 45 wherein said step of providing a mold includes the steps of providing a disposable pattern a first portion of which has a configuration corresponding to the configuration of the article mold cavity and a second portion of which has a configuration corresponding to the configuration of the passage in the crystal selector, applying a wet coating of ceramic mold material over the pattern, at least partially drying the wet coating of ceramic mold material, removing the pattern from within the dried ceramic mold material, and applying a coating of material having a surface with a greater emissivity than the ceramic material of the mold over a first portion of the crystal selector disposed to the one side of the straight longitudinal axis of the crystal selector passage while leaving the ceramic material of a second portion of the crystal selector exposed.

47. A method as set forth in claim 46 wherein said step of applying a coating over the first portion of the crystal selector includes applying a coating having a surface with an emissivity which is at least twice as great as the emissivity of the surface of the ceramic material forming the second portion of the crystal selector.

48. A method as set forth in claim 46 wherein said step of providing a mold includes firing the ceramic mold in an oxidizing atmosphere at a temperature above 540° C., and, thereafter, performing said step of applying a coating of material over the first portion of the crystal selector.

49. A method as set forth in claim 45 wherein said step of growing a single crystal of metal includes growing one single crystal grain upwardly toward the article mold cavity and sidewardly until the one single crystal gain extends across the passage in the crystal selector, and, thereafter, growing the one single crystal grain from the passage in the crystal selector into the article mold cavity.

* * * * *

UNITED STATES PATENT AND TRADEMARK OFFICE
CERTIFICATE OF CORRECTION

PATENT NO. : 4,862,947

DATED : September 5, 1989

INVENTOR(S) : Robert A. Horton; Arunachalam Jeyarajan; and Lawrence D. Graham

It is certified that error appears in the above-identified patent and that said Letters Patent is hereby corrected as shown below:

Column 22, Line 64, Change "gain" to --grain--.

Signed and Sealed this

Eleventh Day of September, 1990

Attest:

HARRY F. MANBECK, JR.

*Attesting Officer*      *Commissioner of Patents and Trademarks*